(12) United States Patent
Choi et al.

(10) Patent No.: US 9,496,063 B2
(45) Date of Patent: Nov. 15, 2016

(54) LIQUID CRYSTAL DISPLAY AND METHOD OF FABRICATING THE SAME

(71) Applicant: Samsung Display Co., Ltd., Yongin (KR)

(72) Inventors: Young Joo Choi, Suwon-si (KR); Seung Ho Jung, Yongin-si (KR); Joon Geol Kim, Hwaseong-si (KR); Kang Moon Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/268,879

(22) Filed: May 2, 2014

(65) Prior Publication Data

US 2015/0206818 A1    Jul. 23, 2015

(30) Foreign Application Priority Data

Jan. 21, 2014  (KR) .................. 10-2014-0007256

(51) Int. Cl.
| | |
|---|---|
| *H01L 29/739* | (2006.01) |
| *H01B 1/02* | (2006.01) |
| *G02F 1/1333* | (2006.01) |
| *G02F 1/1343* | (2006.01) |
| *G02F 1/1345* | (2006.01) |
| *G02F 1/1362* | (2006.01) |

(52) U.S. Cl.
CPC ............ *H01B 1/026* (2013.01); *G02F 1/13439* (2013.01); *G02F 1/13458* (2013.01); *G02F 1/133345* (2013.01); *G02F 1/134363* (2013.01); *G02F 2001/13629* (2013.01); *G02F 2001/134318* (2013.01); *G02F 2001/136295* (2013.01); *H01L 2924/0002* (2013.01)

(58) Field of Classification Search
None
See application file for complete search history.

(56) References Cited

U.S. PATENT DOCUMENTS

2006/0290864 A1* 12/2006 Oh et al. ................ 349/141
2009/0212291 A1*  8/2009 Ikeda ..................... 257/59
(Continued)

FOREIGN PATENT DOCUMENTS

| KR | 10-2006-0076425 | 7/2006 |
|---|---|---|
| KR | 10-2006-0078501 | 7/2006 |
| KR | 10-1186513 | 10/2012 |

*Primary Examiner* — Evren Seven
*Assistant Examiner* — Steven Christopher
(74) *Attorney, Agent, or Firm* — H.C. Park & Associates, PLC

(57) ABSTRACT

A liquid crystal display and a method of fabricating a liquid crystal display (LCD), the LCD including a substrate; gate wiring including a gate pad, a gate electrode, and a gate line, which are formed on the substrate; a gate insulating layer disposed on the gate wiring; an electrode pattern including a connecting electrode, which is disposed on the gate insulating layer and is electrically connected to the gate pad, a source electrode and a drain electrode, which partially overlap the gate electrode; a pixel electrode, which is electrically connected to the drain electrode; a data line, which intersects the gate line; a semiconductor layer disposed on the gate electrode; first auxiliary wiring overlapping the data line and spaced from the semiconductor layer; and second auxiliary wiring overlapping the gate line.

12 Claims, 17 Drawing Sheets

(56) References Cited

U.S. PATENT DOCUMENTS

2010/0155730 A1* 6/2010 Hong et al. .................. 257/59
2011/0318889 A1* 12/2011 Chida ........................ 438/158
2014/0167053 A1* 6/2014 Akiyoshi .................... 257/59

* cited by examiner

LIQUID CRYSTAL DISPLAY AND METHOD OF FABRICATING THE SAME

CROSS-REFERENCE TO RELATED APPLICATIONS

This application claims priority from and the benefit of Korean Patent Application No. 10-2014-0007256, filed on Jan. 21, 2014, which is hereby incorporated by reference for all purposes as if fully set forth herein.

BACKGROUND

Field

Exemplary embodiments of the present invention relate to a liquid crystal display (LCD) and a method of fabricating the same, and more particularly, to a transverse electric field-type LCD and a method of fabricating the same.

Discussion of the Background

A liquid crystal display (LCD), which is one of the most widely used types of flat panel displays, adjust the amount of light transmitted therethrough by applying a voltage to electrodes so as to reorient liquid crystal molecules within a liquid crystal layer.

LCDs are easily fabricated as thin displays, but have relatively poor lateral visibility as compared to their front visibility. To address the shortcomings of LCDs, various liquid crystal alignment and driving methods have been developed. More specifically, to realize wide viewing angles, LCDs have been developed in which a pixel electrode and a common electrode are formed together on a single substrate.

In an LCD having a pixel electrode and a common electrode formed on the same substrate, at least one of the two electric field-generating electrodes, i.e., the pixel electrode and the common electrode, has a plurality of incisions and a plurality of branch electrodes defined by the plurality of incisions, respectively.

However, the formation of two electric field-generating electrodes on a single thin-film transistor (TFT) array substrate requires the use of separate photo masks for the two electric field-generating electrodes, thereby increasing the manufacturing cost of an LCD. Also, when a voltage is applied to common electrodes that are electrically connected to each other, signals applied to the common electrodes may be delayed.

The above information disclosed in this Background section is only for enhancement of understanding of the background of the invention and, therefore, it may contain information that does not constitute prior art.

SUMMARY

Exemplary embodiments of the present invention provide a liquid crystal display (LCD) capable of suppressing the generation of copper oxide ($CuO_x$) that may be generated in response to a copper electrode and a passivation layer being placed in contact with each other.

Exemplary embodiments of the present invention also provide an LCD capable of reducing the electric resistance applied to a data line and a common electrode.

Exemplary embodiments of the present invention also provide a method of fabricating an LCD capable of suppressing the generation of $CuO_x$ that may be generated in response to a copper electrode and a passivation layer being placed in contact with each other.

Exemplary embodiments of the present invention also provide a method of fabricating an LCD capable of reducing the electric resistance applied to a data line and a common electrode.

Additional features of the invention will be set forth in the description which follows and, in part, will be apparent from the description, or may be learned by practice of the invention.

An exemplary embodiment of the present invention discloses a liquid crystal display (LCD), including a substrate; gate wiring including a gate pad, a gate electrode, and a gate line, all of which are formed on the substrate; a gate insulating layer disposed on the gate wiring; an electrode pattern disposed on the gate insulating layer and including a connecting electrode, which is disposed on the gate insulating layer and is electrically connected to the gate pad, a source electrode and a drain electrode, both of which partially overlap the gate electrode, a pixel electrode electrically connected to the drain electrode, and a data line intersecting the gate line; a semiconductor layer disposed on the gate electrode; first auxiliary wiring overlapping the data line and spaced from the semiconductor layer; and second auxiliary wiring overlapping the gate line.

Another exemplary embodiment of the present invention discloses a method of fabricating an LCD, including forming gate wiring on a substrate, the gate wiring including a gate pad, a gate electrode and a gate line; forming a gate insulating layer on the gate wiring; forming an electrode pattern on the gate insulating layer, the electrode pattern including a connecting electrode, a source electrode, a drain electrode, a data line, and a pixel electrode; forming a semiconductor layer on the gate electrode; placing an etch stopper on the semiconductor layer; forming first auxiliary wiring on the data line; and forming second auxiliary wiring overlapping the gate line.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
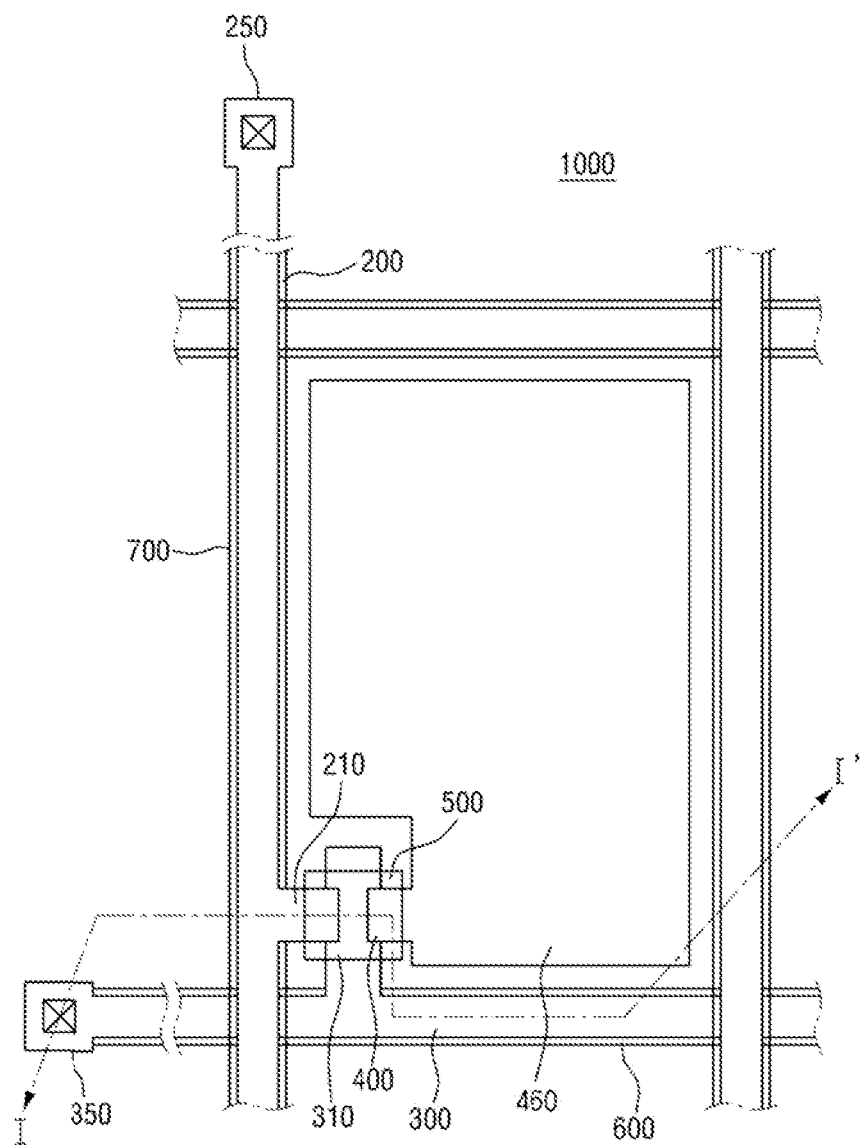
FIG. 1 is a plan view illustrating a liquid crystal display (LCD) according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It will be understood that when an element or layer is referred to as being "on", "connected to", or "coupled to" another element or layer, it can be directly on, directly connected to, or directly coupled to the other element or layer, or intervening elements or layers may be present. In contrast, when an element is referred to as being "directly on," "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). As used herein, the term "and/or" includes any and all combinations of one or more of the associated listed items.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, exemplary embodiments of the present invention will be described with reference to the attached drawings.

Figure 2:
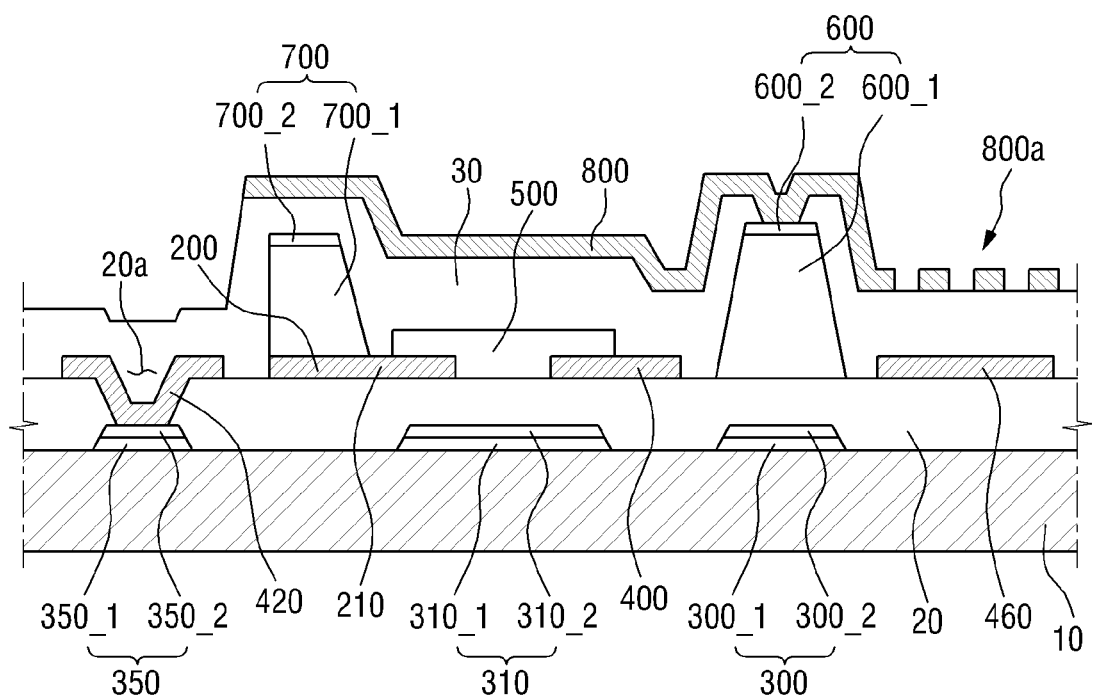
FIG. 2 is a cross-sectional view taken along line I-I' of FIG. 1.

Referring to FIGS. 1 and 2, an LCD according to an exemplary embodiment includes: a substrate 10, gate wiring including a gate pad 350, a gate electrode 310, and a gate line 300 that are formed on the substrate 10; a gate insulating layer 20 disposed on the gate wiring, an electrode pattern including a connecting electrode 420 disposed on the gate insulating layer 20 and electrically connected to the gate pad 350, a source electrode 210 and a drain electrode 400 disposed to overlap the gate electrode 310, and a pixel electrode 460 electrically connected to the drain electrode 400; a semiconductor layer 500 disposed on the gate electrode 310; first auxiliary wiring 700 formed on the source electrode 210 so as to be spaced from the semiconductor layer 500; and second auxiliary wiring 600 overlapping the gate line 300.

The substrate 10 may include insulating material, such as glass or plastic. The substrate 10 may be rigid or flexible, and may be formed of polyimide.

The gate wiring may be disposed on the substrate 10. The gate wiring may include the gate pad 350, the gate electrode 310, and the gate line 300.

The gate pad 350 may be electrically connected to other layers of the LCD or an external driving circuit (not illustrated). Signals may be received from the external driving circuit through the gate line.

A plurality of gate lines 300 may be arranged in parallel with each other and to extend in a first direction.

For example, the gate line 300 may include at least one of an aluminum (Al)-based metal, such as Al or an Al alloy; a silver (Ag)-based metal, such as Ag or an Ag alloy; a copper (Cu)-based metal, such as Cu or a Cu alloy; a molybdenum-based metal, such as Mo or an Mo alloy; chromium (Cr); tantalum (Ta); and titanium (Ti). In another example, a transparent or semi-transparent conductive material may be used to form the gate line 300.

The gate wiring may have a single-layer structure or a multilayer structure including at least two conductive layers having different physical properties.

The gate wiring may be formed as a layer of Ti and a layer of Cu. More specifically, the gate pad 350 may include a first sub-gate electrode 350_1 formed of Ti and a second sub-gate electrode 350_2 formed of Cu.

The gate electrode 310 may also be formed as a layer of Ti and layer of Cu. More specifically, the gate electrode 310 may include a first sub-gate electrode 310_1 formed of Ti and a second sub-gate electrode 310_2 formed of Cu.

The gate line 300 may also be formed as a layer of Ti and a layer of Cu. More specifically, the gate line 300 may include a first sub-gate line 300_1 formed of Ti and a second sub-gate line 300_2 formed of Cu.

For example, the first sub-gate pad 350_1, the first sub-gate electrode 310_1, and the first sub-gate line 300_1 may be formed substantially at the same time and/or using the same process, and the second sub-gate pad 350_2, the second sub-gate electrode 310_2, and the second sub-gate line 300_2 may be formed substantially at the same time and/or using the same process.

The gate insulating layer 20 may be formed on the gate wiring. For example, the gate insulating layer 20 may include silicon nitride ($SiN_x$) or silicon oxide ($SiO_x$). For example, the gate insulating layer 20 may have a single-layer structure or a multilayer structure including at least two insulating layers having different physical properties, or the like.

A first contact hole 20a may be formed on the gate insulating layer 20 so as to at least partially expose the gate pad 350 therethrough.

The electrode pattern, including the connecting electrode 420, the source electrode 210, the drain electrode 400, and the pixel electrode 460, may be formed on the gate insulating layer 20. The electrode pattern may also include a data line 200 and a data pad 350 for connection to other layers of the LCD or an external driving circuit (not illustrated).

The connecting electrode 420, the source electrode 210, the drain electrode 400, the pixel electrode 460, and the data line 200 may be formed substantially at the same time by using the same material and/or the same process.

For example, the electrode pattern may be formed by sputtering or dry and/or wet etching using a photo mask. The electrode pattern may be formed of indium tin oxide (ITO) or indium zinc oxide (IZO).

The connecting electrode 420 may be electrically connected to the gate pad 350. The connecting electrode 420 may improve the contact performance of the gate pad 350 with respect to an external driving circuit (not illustrated) electrically connected to the gate pad 350. The connecting electrode 420 may also reduce the electrical resistance between the gate pad 350 and the external driving circuit. That is, the connecting electrode 420 may improve contact performance and reduce resistance by increasing the area of contact between the contact pad 350 and the external driving circuit.

The data line 200 may be insulated from the gate line 300 by the gate insulating layer 20, and may extend in a second direction that intersects the first direction. A plurality of data lines 200 may be arranged in parallel with one another, and a plurality of pixel regions may be at least partially defined by the plurality of data lines 200 and a plurality of gate lines 300.

The source electrode 210 may be formed to protrude beyond the data line 200. The drain electrode 400 may be spaced apart from the source electrode 210.

The pixel electrode 460 may extend from one end of the drain electrode 400. That is, the pixel electrode 460 may be electrically connected to the drain electrode 400.

The elements of the electrode pattern may be formed of the same material and on the same level/layer.

The semiconductor layer 500 may be formed on the gate insulating layer 20. The semiconductor layer 500 may include amorphous silicon or polycrystalline silicon. For example, the semiconductor layer 500 may include an oxide semiconductor such as, for example, an indium gallium zinc oxide (IGZO)-based oxide semiconductor.

The semiconductor layer 500 may be disposed between the source electrode 210 and the drain electrode 400. For example, the semiconductor layer 500 may partially overlap the source electrode 210 and the drain electrode 400.

The gate electrode 310, the source electrode 210 and the drain electrode 400 may form a single thin-film transistor (TFT) together with the semiconductor layer 500, and the channel of the TFT may be formed in the semiconductor layer 500, which is disposed between the source electrode 210 and the drain electrode 400.

The first auxiliary wiring 700 may be disposed on the data line 200, and may directly contact the data line 200. The first auxiliary wiring 700 may reduce the electrical resistance applied to the data line 200. The first auxiliary wiring 700 may be spaced apart from the semiconductor layer 500. Thus, the TFT, including the semiconductor layer 500, may be prevented from being affected by the first auxiliary wiring 700, and more particularly, the sidewall of the first auxiliary wiring 700 that faces the semiconductor layer 500.

The first auxiliary wiring 700 may at least partially overlap the data line 200, and may extend along the data line 200.

The first auxiliary wiring 700 may include a layer of Cu and a layer of Ti. More specifically, the first auxiliary wiring 700 may include a first wiring layer 700_1 disposed on the data line 200 and a second wiring layer 700_2 disposed on the first wiring layer 700_1. For example, the first wiring layer 700_1 may be formed of Cu, and the second wiring layer 700_2 may be formed of Ti.

The second auxiliary wiring 600 may be disposed on the gate insulating layer 20 to overlap the gate line 300. The second auxiliary wiring 600 may overlap the gate line 300 with the gate insulating layer 20 interposed therebetween. That is, the second auxiliary wiring 600 may be insulated from the gate line 300 by the gate insulating layer 20.

The second auxiliary wiring 600 may be electrically connected to a common electrode 800. The second auxiliary wiring 600 may reduce the electrical resistance applied to the common electrode 800.

The second auxiliary wiring 600 may at least partially overlap the gate line 300, and may extend along the gate line 300.

The second auxiliary wiring 600 may include a layer of Cu and a layer of Ti. More specifically, the second auxiliary wiring 600 may include a first wiring layer 600_1 disposed on the gate insulating layer 20, and a second wiring layer 600_2 disposed on the first wiring layer 600_1. For example, the first wiring layer 600_1 may be formed of Cu, and the second wiring layer 600_2 may be formed of Ti.

The first wiring layer 700_1 and the first wiring layer 600_1 may be formed substantially at the same time, and the second wiring layer 700_2 and the second wiring layer 600_2 may be formed substantially at the same time.

A passivation layer 30 may be formed on the electrode pattern, the semiconductor layer 500, the first auxiliary wiring 700, and the second auxiliary wiring 600. The passivation layer 30 may include an inorganic insulating material. For example, the inorganic insulating material may include at least one of silicon oxide ($SiO_x$), silicon nitride ($SiN_x$), aluminum oxide ($AlO_x$), and silicon oxynitride (SiON).

The passivation layer 30 may include a second contact hole through which the second auxiliary wiring 600 is exposed. The second auxiliary wiring 600 may be electrically connected to the common electrode 800 through the second contact hole.

The common electrode 800 may be disposed on the passivation layer 30. For example, the common electrode 800 may be formed of ITO or IZO. The common electrode 800 may be formed to partially or completely cover the passivation layer 30.

The common electrode 800 may include an incision pattern 800a. The incision pattern 800a may be disposed above the pixel electrode 460, and may partially overlap the pixel electrode 460.

The alignment of liquid crystal molecules in a liquid crystal layer (not shown) disposed between the substrate 10 and a color filter substrate (not shown) may change as a result of an electric field formed between the incision pattern 800a and the pixel electrode 460. As a result, an image to be displayed may be controlled.

Other exemplary embodiments will hereinafter be described. In FIGS. 1 to 5, like reference numerals indicate like elements, and thus, detailed descriptions thereof will be omitted.

Figure 3:
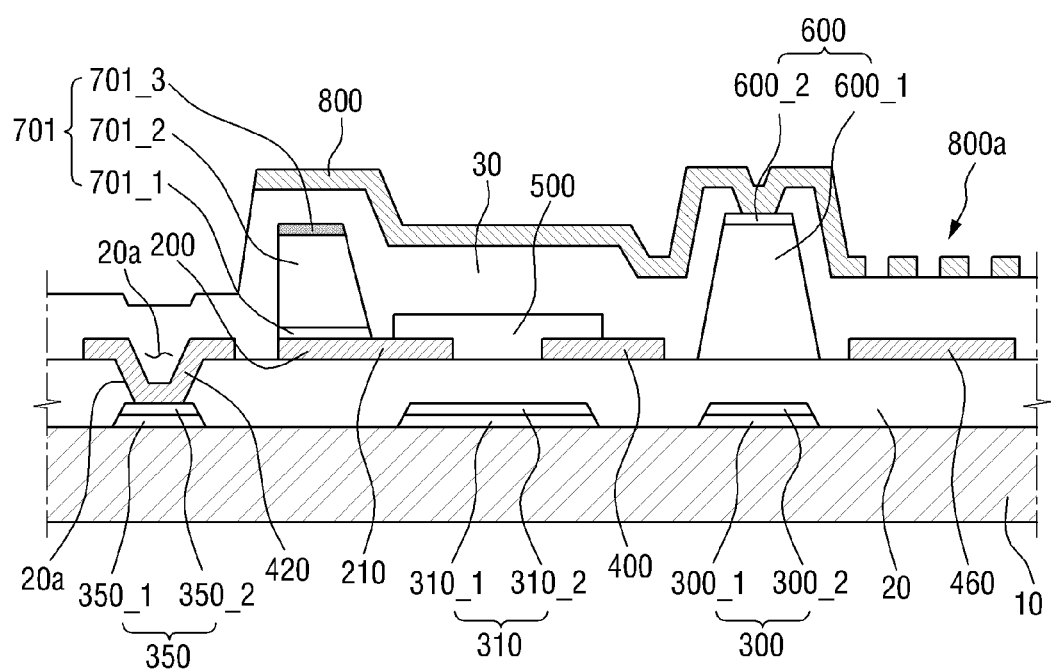
FIG. 3 is a cross-sectional view illustrating an LCD according to another exemplary embodiment of the present invention.

FIG. 3 is a cross-sectional view illustrating an LCD according to another exemplary embodiment.

The LCD of FIG. 3 differs from that of FIG. 2 in that it includes first auxiliary wiring 701 having a triple-layer structure.

Referring to FIG. 3, the first auxiliary wiring 701 may have a triple-layer structure. More specifically, the first auxiliary wiring 701 may include a first wiring layer 701_1 placed in direct contact with a data line 200, a second wiring layer 701_2 disposed on the first wiring layer 701_1, and a third wiring layer 701_3 disposed on the second wiring layer 701_2.

The first wiring layer 701_1 and the third wiring layer 701_3 may prevent the second wiring layer 701_2 from directly contacting the data line 200 and a passivation layer 30.

The second wiring layer 701_2 may be formed of Cu. The first wiring layer 701_1 may be formed of an IZO-based material, and the third wiring layer 701_3 may be formed of a gallium zinc oxide (GZO)-based material.

In response to the second wiring layer 701_2, which is formed of Cu, being interposed between the first wiring layer 701_1 and the third wiring layer 701_3, the second wiring layer 701_2 may be prevented from directly contacting the passivation layer 30, thereby preventing the generation of $CuO_x$, which may otherwise be generated.

Figure 4:
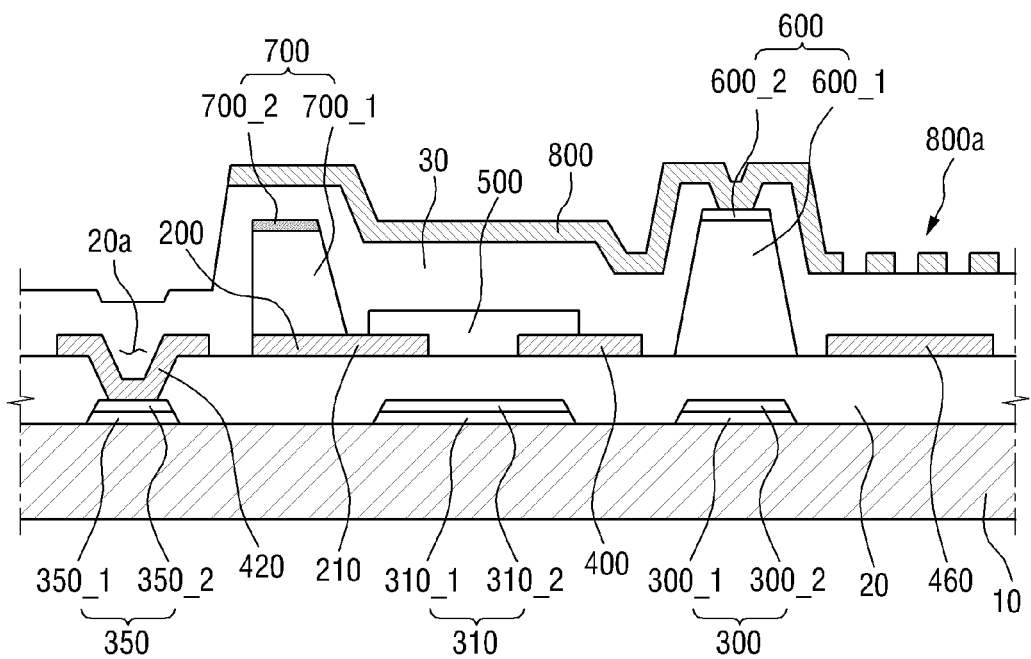
FIG. 4 is a cross-sectional view illustrating an LCD according to another embodiment of the present invention.

FIG. 4 is a cross-sectional view illustrating an LCD according to another exemplary embodiment including first auxiliary wiring 702, which has a first wiring layer 702_1 formed of Cu and a second wiring layer 702_2 formed of a GZO-based material.

In response to the second wiring layer 702_2 being disposed on the first wiring layer 702_1, the first wiring layer 702_1 may be prevented from directly contacting the passivation layer 30, thereby preventing the generation of $CuO_x$, which may otherwise be generated.

Figure 5:
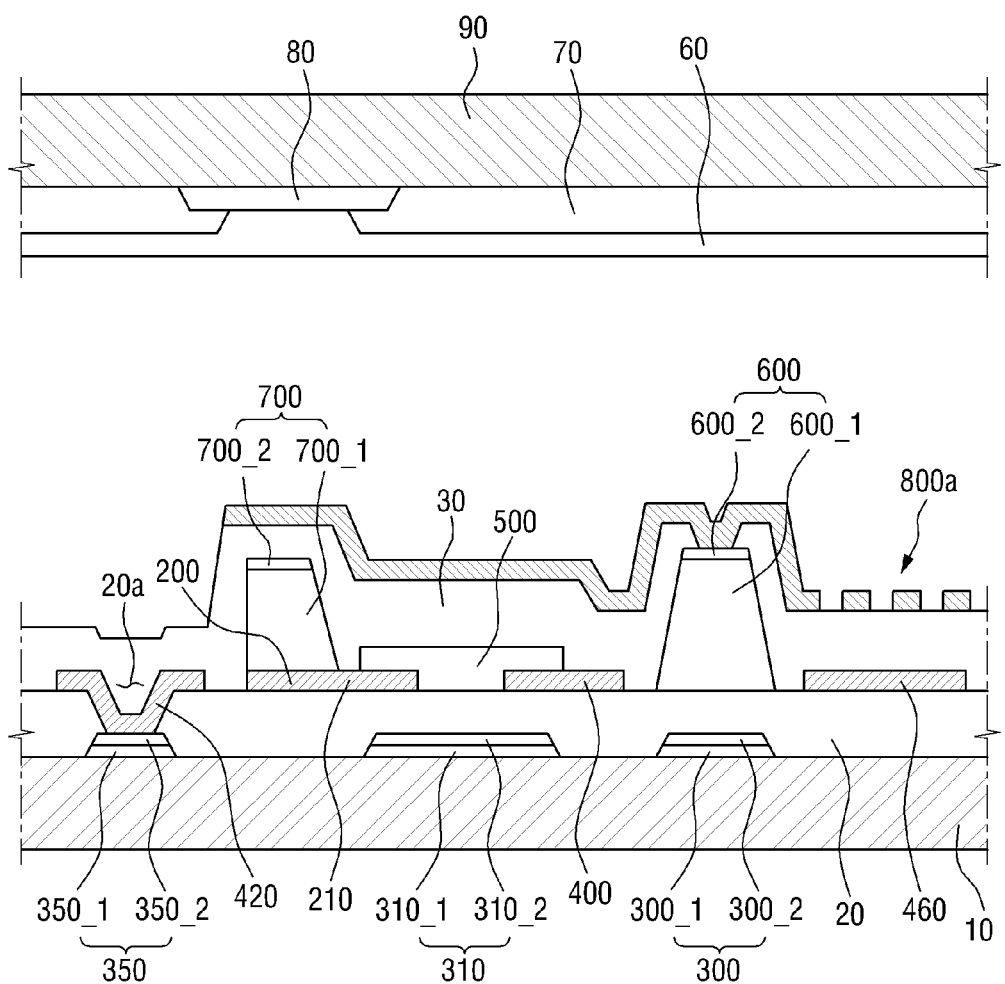
FIG. 5 is a cross-sectional view illustrating an LCD according to another embodiment of the present invention.

FIG. 5 is a cross-sectional view illustrating an LCD according to another exemplary embodiment.

The LCD of FIG. 5 differs from the LCD of FIG. 1 in that it further includes a color filter substrate 90 disposed over and facing a substrate 10.

The color filter substrate 90 may be disposed over the substrate 10 to face the substrate 10. The color filter substrate 90 may be formed of an insulating material such as transparent glass or plastic. A light shield member 80 may be formed on the color filter substrate 90. The light shield member 80 may be a black matrix, and may prevent light leakage.

Color filters 70 may be formed on the color filter substrate 90. An overcoat layer 60 may be formed on the color filters 70 and the light shield member 80. The overcoat layer 60 may include an organic insulating material. The overcoat layer 60 may prevent the color filters 70 from being exposed, and may provide a planar surface for the color filter substrate 90. The overcoat layer 60 may be optional. An alignment layer (not illustrated) may be disposed on the overcoat layer 60.

A liquid crystal layer (not illustrated) may be interposed between the substrate 10 and the color filter substrate 90. The liquid crystal layer may include a nematic-phase liquid crystal material having a positive dielectric anisotropy. Liquid crystal molecules in the liquid crystal layer may be oriented in such a manner that their long axis may be parallel to the substrate 10 and the color filter substrate 90.

FIGS. 6 to 17 are cross-sectional views illustrating a method of fabricating an LCD according to an exemplary embodiment of the present invention.

Figure 6:
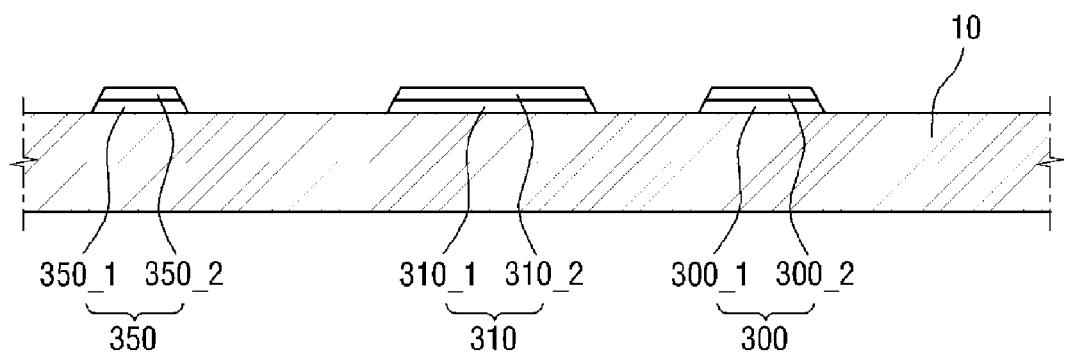
FIGS. 6 to 17 are cross-sectional views illustrating a method of fabricating an LCD, according to an exemplary embodiment of the present invention.

FIG. 6 illustrates a substrate 10 and gate wiring including a gate pad 350, a gate electrode 310, and a gate line 300 similar to their respective counterparts shown in FIGS. 1 to 5. The formation of the gate wiring may include applying a gate wiring material on the substrate 10 through sputtering, forming a first photo mask on the gate wiring material, and patterning the gate wiring material through wet etching.

Figure 7:
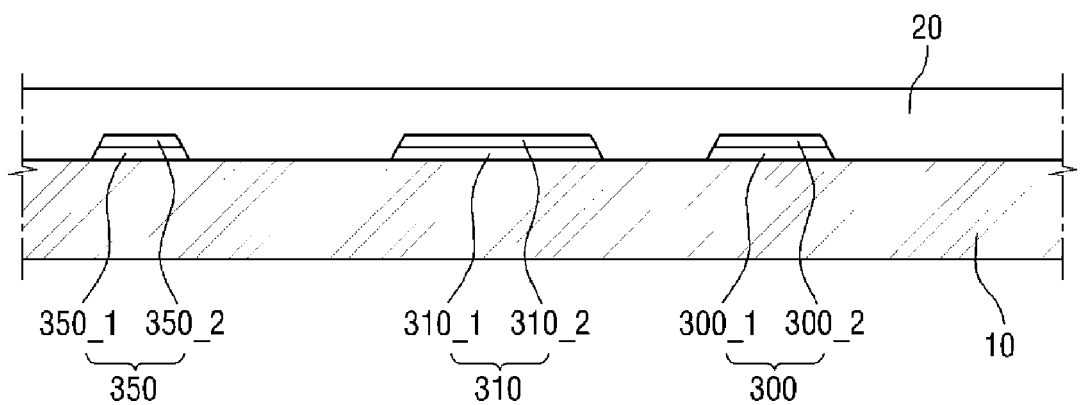
Figure 8:
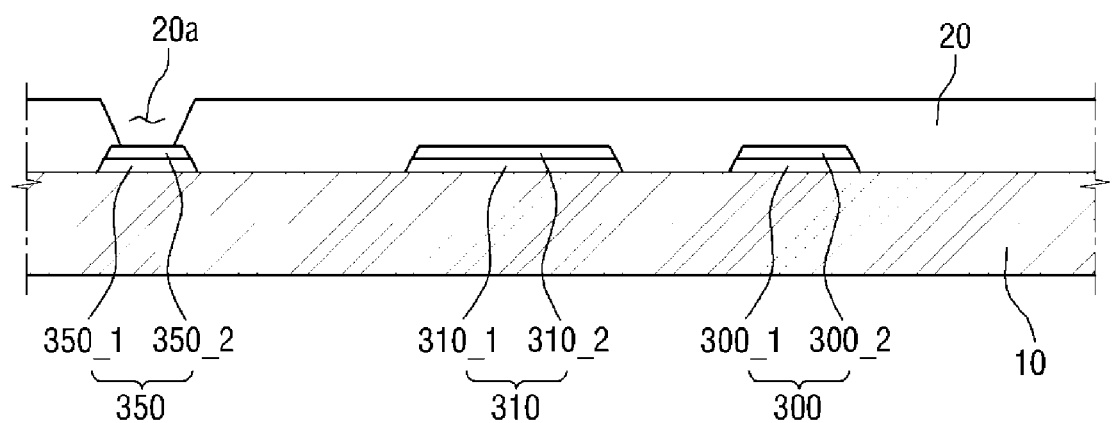

FIGS. 7 and 8, illustrate forming a gate insulating layer 20 on the gate wiring, the gate insulating layer being similar to its counterpart shown in FIGS. 1 to 5. The formation of the gate insulating layer 20 may include forming a first contact hole 20a, through which the gate pad 350 is exposed, in the gate insulating layer 20. The first contact hole 20a may be formed by dry-etching the gate insulating layer 20, as illustrated in FIG. 8.

Figure 9:
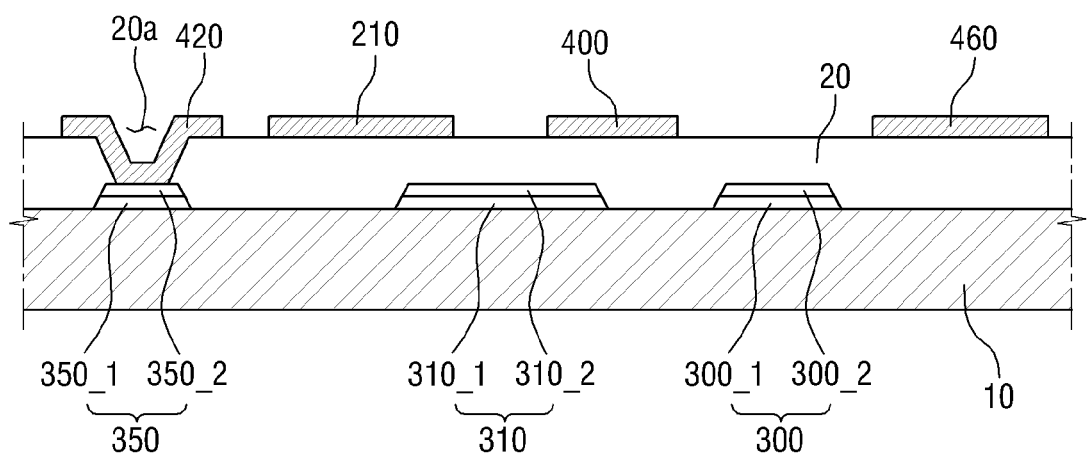
Figure 10:
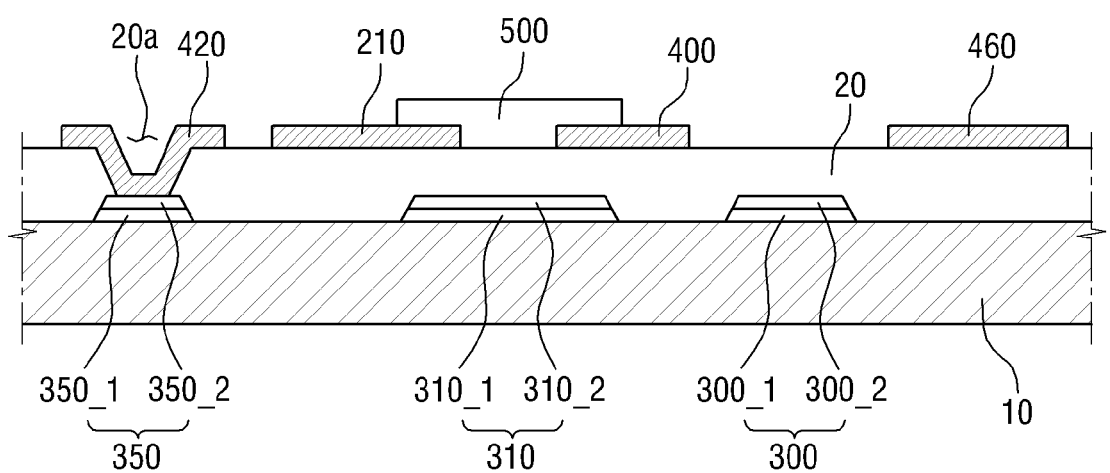

FIG. 9 illustrates forming an electrode pattern on the gate insulating layer 20, the electrode pattern including a connecting electrode 420, a source electrode 210, a drain electrode 400, a pixel electrode 460, and a data line 200, all of which may be similar to their respective counterparts of FIGS. 1 to 5.

As already mentioned above, the electrode pattern may be formed of ITO or IZO.

The formation of the electrode pattern may include applying an electrode pattern material through sputtering, forming a second photo mask on the electrode pattern material, and patterning the electrode pattern material through wet etching.

Thereafter, a semiconductor layer 500 similar to its counterpart shown in FIGS. 1 to 5 may be formed on the gate electrode 310, and an etch stopper 500a may be disposed on the semiconductor layer 500. The formation of the semiconductor layer 500 and the placement of the etch stopper will hereinafter be described with reference to FIGS. 10 and 11.

Figure 11:
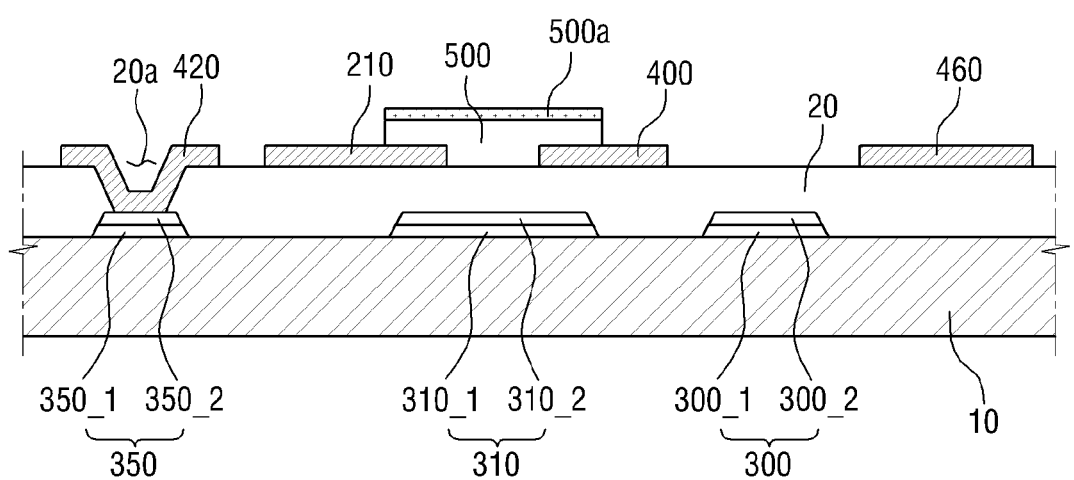

As shown in FIG. 11, the etch stopper 500a may be disposed on the semiconductor layer 500 to cover the semiconductor layer 500. The etch stopper 500a may include Mo.

Figure 12:
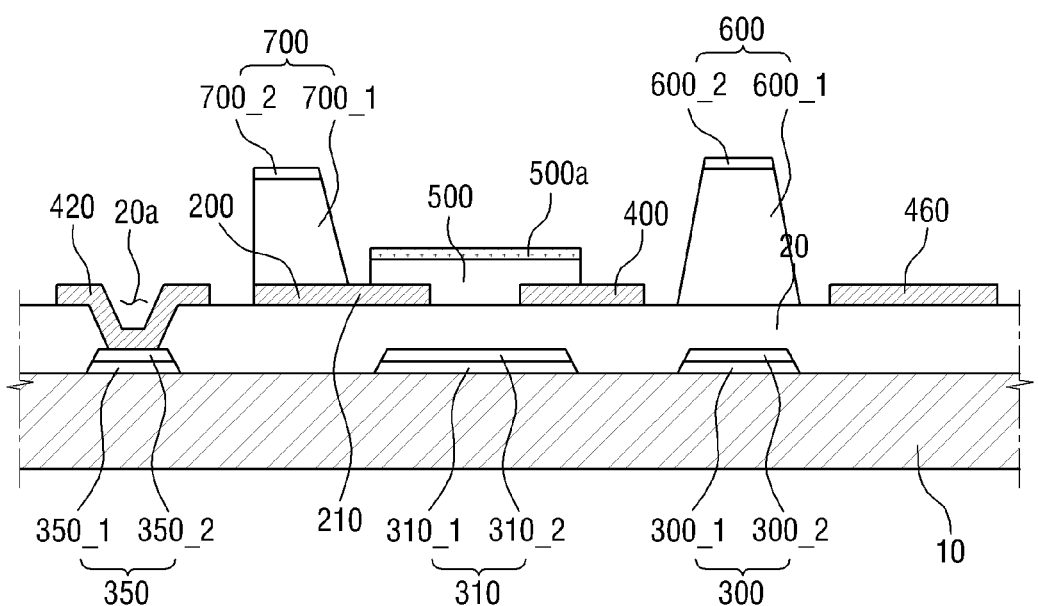
Figure 13:
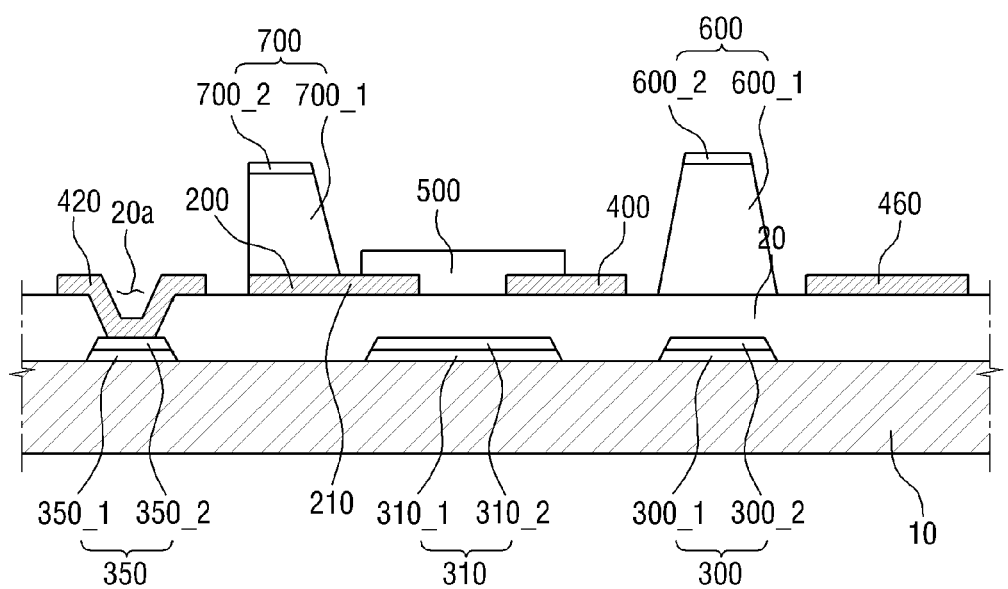

As shown in FIGS. 12 and 13, a first auxiliary wiring 700 and a second auxiliary wiring 600, similar to their counterparts shown in FIGS. 1 to 5, are then formed. The first auxiliary wiring 700 may be formed on the data line 200, and the second auxiliary wiring 600 may be formed to overlap the gate line 300. The formation of the first auxiliary wiring 700 and the second auxiliary wiring 600 may include applying an auxiliary wiring material through sputtering, forming a third photo mask on the auxiliary wiring material, and patterning the auxiliary wiring material through wet etching. For example, an ammonium persulfate (APS)-based etchant may be used. In another example, an NOC-based etchant with fluorine (F) removed therefrom may be used. Various etchants, other than those set forth herein, may be used as long as they can distinguish the auxiliary wiring material, the electrode pattern, and the etch stopper 500a, thereby allowing a selective etching.

Patterning the auxiliary wiring material using an etchant that allows a selective etching prevents the electrode pattern, which is formed of ITO, and the semiconductor layer 500, which includes the etch stopper 500 that is formed of Mo, from being etched away.

FIG. 13 illustrates the removal of the etch stopper 500a, which is formed of Mo, by dry etching. In a case in which dry etching is used to remove the etch stopper 500a, the electrode pattern, the first auxiliary wiring 700, and the second auxiliary wiring 600, which are on a level with the etch stopper 500a, may not be significantly affected by the removal of the etch stopper 500a.

Figure 14:
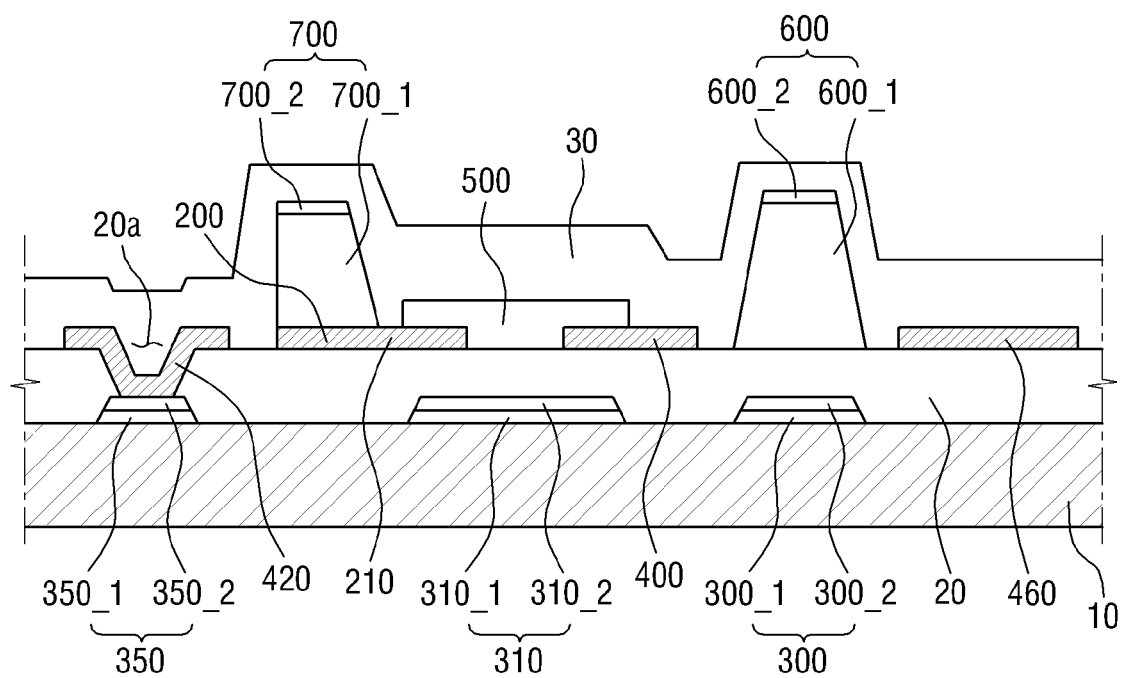

Referring to FIG. 14, a passivation layer 30 similar to its counterpart of FIGS. 1 to 5 may then be formed on the electrode pattern, the first auxiliary wiring 700, the second auxiliary wiring 600, and the semiconductor layer 500.

Figure 15:
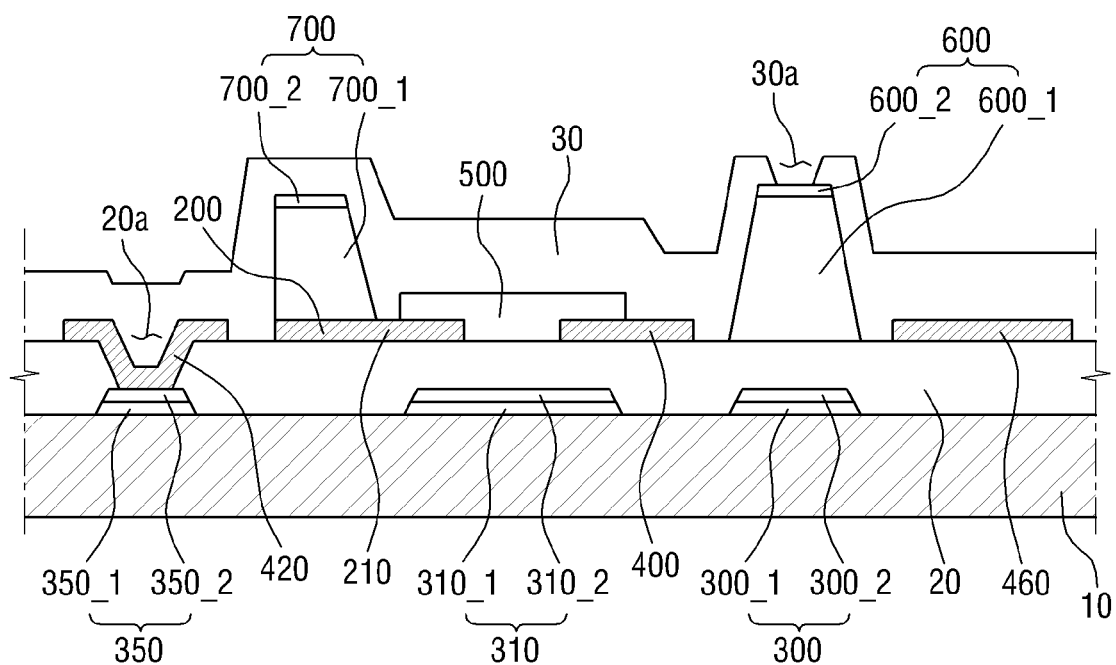

Referring to FIG. 15, a second contact hole 30a may then be formed in the passivation layer 30 to at least partially expose the second auxiliary wiring 600. The second contact hole 30a may be formed by dry etching.

Figure 16:
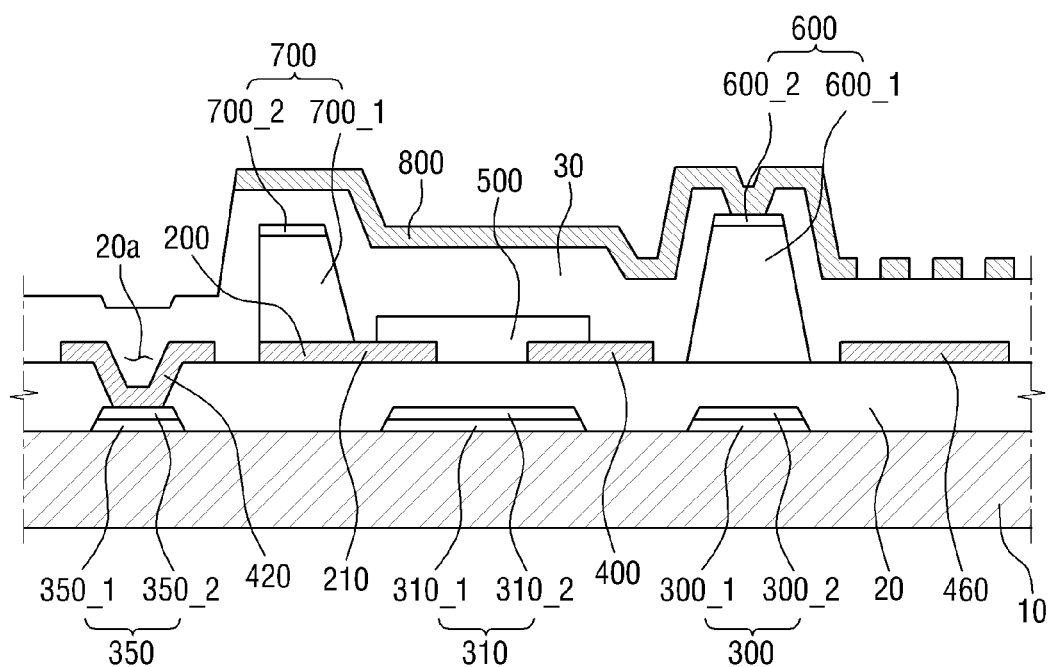

Referring to FIG. 16, a common electrode 800 similar to its counterpart shown in FIGS. 1-5 may be formed on the passivation layer 30, except for the portion of the passivation layer 30 covering gate pad 350. The formation of the common electrode 800 may include applying a common electrode material through sputtering, forming a fourth photo mask on the common electrode material, and patterning the common electrode material through wet etching. Patterning the common electrode material may include forming an incision pattern 800a over the pixel electrode 460.

Figure 17:
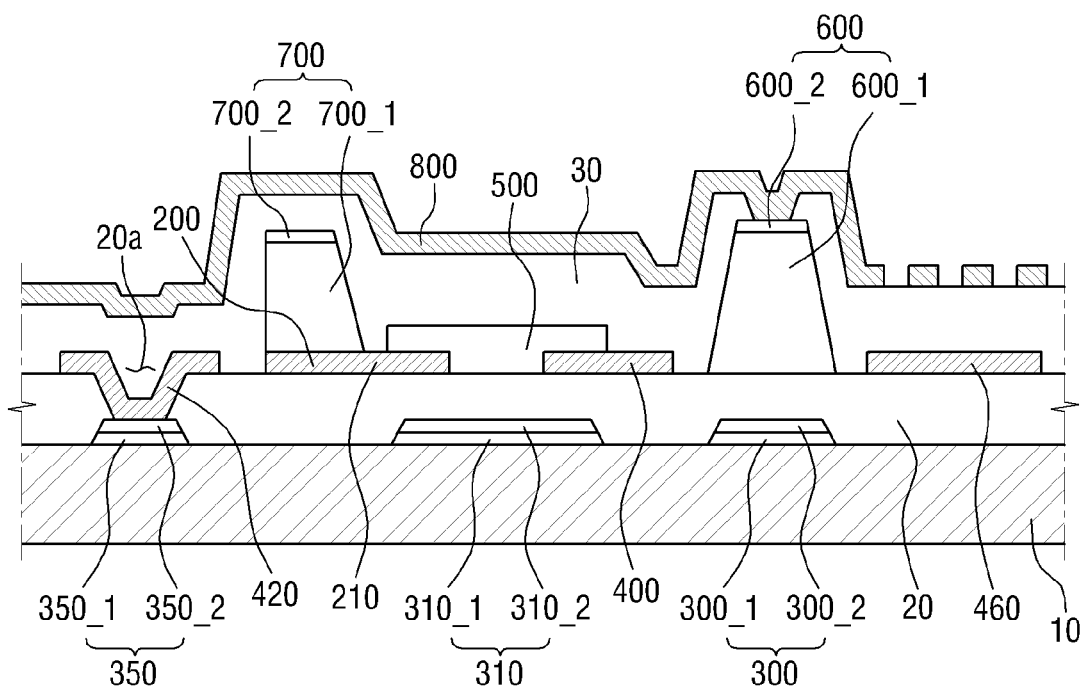

FIG. 17 illustrates a modification of the exemplary embodiment shown in FIG. 16 in which the common electrode 800 is formed on the passivation layer 30 so as to cover the gate pad 350.

According to exemplary embodiments, it is possible to suppress the generation of $CuO_x$ in copper wiring. In addition, it is possible to minimize the influence of $CuO_x$ (if any) on a thin-film transistor (TFT) by spacing the TFT from first auxiliary wiring. It is also possible to reduce the electric resistance applied to a data line and a common electrode.

It will be apparent to those skilled in the art that various modifications and variations can be made in the present invention without departing from the spirit or scope of the invention. Thus, it is intended that the present invention cover the modifications and variations of this invention, provided they come within the scope of the appended claims and their equivalents.

What is claimed is:

1. A liquid crystal display (LCD), comprising:
 a substrate;
 gate wiring disposed on the substrate, the gate wiring comprising
  a gate pad;
  a gate electrode; and
  a gate line;
 a gate insulating layer disposed on the gate wiring;
 an electrode pattern disposed on the gate insulating layer, the electrode pattern comprising:
  a connecting electrode electrically connected to the gate pad;
  a source electrode partially overlapping the gate electrode;
  a drain electrode partially overlapping the gate electrode;
  a pixel electrode electrically connected to the drain electrode; and
  a data line intersecting the gate line;
 a semiconductor layer disposed on the gate electrode;
 first auxiliary wiring overlapping the data line and spaced apart from the semiconductor layer; and
 second auxiliary wiring overlapping the gate line and insulated from the gate line by the gate insulating layer, wherein the length of the second auxiliary wiring extends along the length of the gate line.

2. The LCD of claim 1, wherein the semiconductor layer comprises an indium gallium zinc oxide (IGZO)-based oxide semiconductor.

3. The LCD of claim 1, wherein each of the gate electrode, the gate pad, and the gate line comprises a layer of titanium (Ti) and a layer of copper (Cu).

4. The LCD of claim 1, wherein the connecting electrode, the source electrode, the drain electrode, the pixel electrode, and the data line of the electrode pattern are disposed in the same layer.

5. The LCD of claim 4, wherein the electrode pattern comprises indium tin oxide (ITO) or indium zinc oxide (IZO).

6. The LCD of claim 1, wherein the first auxiliary wiring extends along the data line and is spaced apart from the semiconductor layer.

7. The LCD of claim 6, wherein the first auxiliary wiring comprises a layer of Cu and a layer of Ti.

8. The LCD of claim 6, wherein the first auxiliary wiring comprises a layer of IZO, a layer of Cu, and a layer of gallium zinc oxide (GZO).

9. The LCD of claim 1, wherein the second auxiliary wiring extends along the gate line.

10. The LCD of claim 9, further comprising a passivation layer disposed on the electrode pattern,
 wherein the second auxiliary wiring is electrically connected to a common electrode through a contact hole formed in the passivation layer.

11. The LCD of claim 9, wherein the second auxiliary wiring comprises a layer of Cu and a layer of Ti.

12. The LCD of claim 1, further comprising: a color filter substrate disposed over the substrate so as to face the substrate; and
 a light shield member, color filters, and an overcoat layer disposed on the color filter substrate,
 wherein the overcoat layer covers the color filters.

* * * * *